United States Patent
Lau et al.

(10) Patent No.: US 12,551,981 B2
(45) Date of Patent: Feb. 17, 2026

(54) MACHINE LEARNING FOR CLASSIFYING RETAINING RINGS

(71) Applicant: Applied Materials, Inc., Santa Clara, CA (US)

(72) Inventors: Eric Lau, Santa Clara, CA (US); Andrew J. Nagengast, Sunnyvale, CA (US); Charles C. Garretson, Monterey, CA (US); Huanbo Zhang, San Jose, CA (US); Zhize Zhu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1032 days.

(21) Appl. No.: 17/678,932

(22) Filed: Feb. 23, 2022

(65) Prior Publication Data

US 2022/0281052 A1 Sep. 8, 2022

Related U.S. Application Data

(60) Provisional application No. 63/157,512, filed on Mar. 5, 2021.

(51) Int. Cl.
*B24B 37/005* (2012.01)
*B24B 37/32* (2012.01)

(52) U.S. Cl.
CPC ............ *B24B 37/005* (2013.01); *B24B 37/32* (2013.01)

(58) Field of Classification Search
None
See application file for complete search history.

(56) References Cited

U.S. PATENT DOCUMENTS

| 9,067,295 | B2 | 6/2015 | Deshpande et al. | |
| 2005/0191947 | A1 | 9/2005 | Chen et al. | |
| 2012/0053717 | A1* | 3/2012 | Duboust | B65B 1/366 |
| | | | | 700/100 |
| 2014/0027407 | A1* | 1/2014 | Deshpande | B24B 37/30 |
| | | | | 216/53 |
| 2019/0283209 | A1 | 9/2019 | Osterheld et al. | |

(Continued)

FOREIGN PATENT DOCUMENTS

| CN | 110948374 A | 4/2020 |
| JP | 2009-260142 | 11/2009 |

(Continued)

OTHER PUBLICATIONS

International Search Report and Written Opinion in International Appln. No. PCT/US2022/017538, dated Jun. 3, 2022, 7 pages.
Jiang et al., "Object Detection and Classification of Metal Polishing Shaft Surface Defects Based on Convolutional Neural Network Deep Learning," Applied Sciences, Dec. 20, 2019, 10(1):87, 30 pages.

(Continued)

*Primary Examiner* — Shamim Ahmed
(74) *Attorney, Agent, or Firm* — Fish & Richardson P.C.

(57) ABSTRACT

A method for optimizing polishing includes, for each respective retaining ring of a plurality of retaining rings mounted on a particular carrier head, performing measurements for a bottom surface of the respective retaining ring mounted on the particular carrier head using a coordinate measurement machine and collecting a respective removal profile of a substrate polished using the respective retaining ring. A machine learning model is trained based on the measurements of the bottom surface of the retaining ring and the respective removal profiles.

15 Claims, 7 Drawing Sheets

(56) References Cited

U.S. PATENT DOCUMENTS

| | | | |
|---|---|---|---|
| 2019/0286075 A1* | 9/2019 | Yennie | H01L 21/67092 |
| 2019/0299356 A1 | 10/2019 | Xu et al. | |
| 2020/0023487 A1 | 1/2020 | Namiki et al. | |
| 2020/0101579 A1 | 4/2020 | Suzuki | |
| 2020/0130130 A1 | 4/2020 | Chen et al. | |
| 2020/0130134 A1* | 4/2020 | Chen | H01L 21/3212 |

FOREIGN PATENT DOCUMENTS

| | | |
|---|---|---|
| JP | 2015-196211 A | 11/2015 |
| JP | 2018-103284 A | 7/2018 |
| JP | 2020-138265 A | 9/2020 |
| KR | 10-2020- 0128757 | 11/2020 |
| TW | 201836763 | 10/2018 |
| TW | 201938321 | 10/2019 |

OTHER PUBLICATIONS

Office Action in Taiwanese Appln. No. 111107932, dated Apr. 12, 2023, 8 pages (with English Search Report).

Office Action in Japanese Appln. No. 2023-553599, dated Nov. 5, 2024, 8 pages (with English translation).

Office Action in Chinese Appln. No. 202210224774.7, mailed on Apr. 30, 2025, 12 pages (with English translation).

Yu et al., "Predictive modeling of material removal rate in schemical mechannical planarization with physics-informed machine learning," Wear, Apr. 2019, 426-427(Part B):1430-1438.

* cited by examiner

MACHINE LEARNING FOR CLASSIFYING RETAINING RINGS

CROSS-REFERENCE TO RELATED APPLICATIONS

This application claims priority to U.S. Provisional Application Ser. No. 63/157,512, filed on Mar. 5, 2021, the disclosure of which is incorporated by reference.

TECHNICAL FIELD

The present disclosure relates generally to chemical mechanical polishing, and more particularly to classifying retaining rings using machine learning.

BACKGROUND

An integrated circuit is typically formed on a substrate (e.g., a semiconductor wafer) by the sequential deposition of conductive, semiconductive or insulative layers on a silicon wafer, and by the subsequent processing of the layers.

One fabrication step involves depositing a filler layer over a non-planar surface and planarizing the filler layer. For certain applications, the filler layer is planarized until the top surface of a patterned layer is exposed or a desired thickness remains over the underlying layer. In addition, planarization may be used to planarize the substrate surface, e.g., of a dielectric layer, for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. In some polishing machines, the carrier head includes a membrane that forms multiple independently pressurizable radially concentric chambers, with the pressure in each chamber controlling the polishing rate in each corresponding region on the substrate. A polishing liquid, such as slurry with abrasive particles, is supplied to the surface of the polishing pad.

As a separate issue, machine learning is widely used for assisting automation through experience (e.g., historical data), for example, classifying items into different categories. Machine learning can be divided into three broad categories: supervised learning using input data having known category labels, unsupervised learning using input data without knowing category labels, and reinforcement learning aiming to reach a particular goal by navigating and interacting with an environment. Unsupervised learning has been used in marketing (e.g., customer segmentation), biology (e.g., clustering DNA patterns), and finance (e.g., anomaly detection or fraud detection), to name a few examples.

One branch of machine learning is deep learning, where neural networks are usually employed. Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of parameters.

SUMMARY

A method for evaluating polishing includes for each respective retaining ring of a plurality of retaining rings mounted to a particular carrier head, performing measurements for a bottom surface of the respective retaining ring mounted on the particular carrier head using a coordinate measurement machine. The measurements represent a characteristic of the bottom surface. An unsupervised learning algorithm is performed to classify each of the plurality of retaining rings in a respective category based on measurements of the plurality of retaining rings, classifications generated by the unsupervised learning algorithm are stored, and the classifications are evaluated against polishing profile measurements to determine parameters that drive profile differences.

In another aspect, a method for optimizing polishing includes, for each respective retaining ring of a plurality of retaining rings mounted on a particular carrier head, performing measurements for a bottom surface of the respective retaining ring mounted on the particular carrier head using a coordinate measurement machine and collecting a respective removal profile of a substrate polished using the respective retaining ring. A machine learning model is trained based on the measurements of the bottom surface of the retaining ring and the respective removal profiles.

Certain implementations can include, but are not limited to, one or more of the following possible advantages.

Measurements can be taken across a bottom surface of a retaining ring with high resolution, e.g., as a mesh scan over the entire bottom surface of the retaining ring. This generates sufficient geometrical information to enable analysis of retaining ring characteristics. The analyzed characteristics of a particular retaining ring can be associated with one or more polishing profiles of a substrate polished using the retaining ring, permitting determination of one or more parameters related to the retaining ring that drive the polishing profile differences.

In addition, polishing profiles can be predicted based on the measurements collected by mesh scanning. Specifically, one or more retaining rings can be classified into a respective category of a plurality of categories using unsupervised machine learning algorithms. Each classified retaining ring can be associated with one or more polishing profiles of respective substrates polished using the classified retaining ring.

A neural network model can be trained by receiving as input the geometry information of classified retaining rings with associated polishing profiles. The neural network model can then be used to predict a polishing profile by performing inferences operations in the trained neural network receiving as an input a measured bottom surface profile of a retaining ring.

Time to production can be improved. Using the described techniques, a system can more efficiently detect whether a retaining ring, before or after the break-in process, can be used for polishing a substrate according to different polishing requirements. The system can also efficiently determine if a retaining ring has yet been sufficiently broken-in, and provide user information or guidance for further break-in process based on the classification results.

Quality control of the polishing process can be improved, and throughput can be increased. Specifically, retaining rings having defects can be identified and replaced. Polishing rates in one or more regions of a substrate undergoing polishing can be adjusted based on the predicted polishing profile associated with a retaining ring, thus enhancing within-wafer uniformity during polishing and eventually achieve higher throughput.

Moreover, the described techniques can scale up readily at a low computational cost. The system can further adjust or modify the classification and the neural network model based on later measured geometry data and polishing profiles, eliminating unnecessary re-computations and decreasing computational costs. The stored classification data and neural network models can be accessed and utilized by one or more polishing apparatuses in different locations simultaneously, without recalculating, which permits an easy scaling-up for a system of a plurality of polishing apparatuses.

The details of one or more embodiments of the invention are set forth in the accompanying drawings and the description below. Other features, objects, and advantages are apparent from the description and drawings, and from the claims.

DESCRIPTION OF DRAWINGS

Like reference numbers and designations in the various drawings indicate like elements.

DETAILED DESCRIPTION

Figure 1:
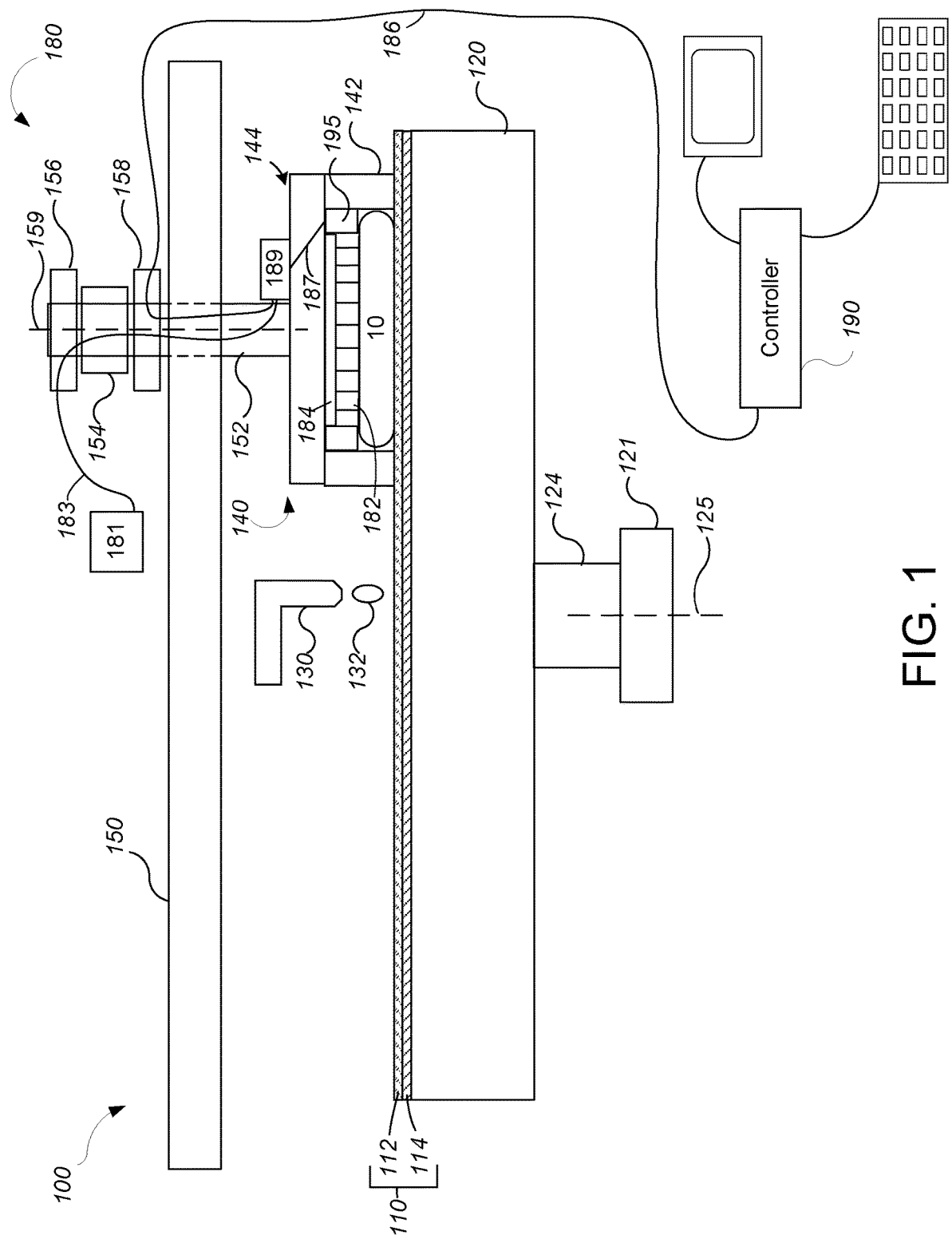
FIG. 1 illustrates a schematic cross-sectional view of an example of a polishing apparatus, including a retaining ring.

Ideally, a substrate undergoing polishing would have a substantially uniform polishing rate across the surface of the substrate. In practice, however, different radial and/or angular regions of the substrate may have a different polishing rates. In addition, a substrate to be polished can have initial radial and/or angular non-uniformity.

Once source of polishing non-uniformity is variation in the profile of the bottom surface of the retaining ring. That is, a slight difference in the bottom surface profiles of two retaining rings can result in different polishing rates in the edge region. By correlating the bottom surface profile of a retaining ring with the polishing profile of the substrate, polishing performance can be better understood. Moreover the polishing process can be adjusted, for example by changing a pressure applied to the substrate, to improve the uniformity of polishing rate of an edge region.

Conventionally, only a few measurement points are made across the entire bottom surface of a retaining ring when checking the bottom surface profile. Thus, prior techniques may not obtain adequate information to analyze characteristics of the bottom surface of the retaining ring. Although techniques such as "ring break-in" have applied to retaining rings before the rings are used in production of integrated circuits, but the accuracy requirement are becoming more stringent, and the "ring break-in" also increases the machine downtime and therefore the cost of production.

However, techniques described herein can improve throughput, decrease production cost, and enhance polishing quality (e.g., decreasing non-uniformities near the substrate edge).

A bottom surface of a retaining ring can be measured with high definition using a coordinate measurement machine (CMM) to generate a high-quality bottom surface profile for further analysis. Each of a plurality retaining rings can be classified into a respective category using an unsupervised machine learning algorithm, and the classification information can be used to obtain parameters relevant to polishing profile differences.

A neural network model can be trained receiving as input the classification of each retaining ring and polishing profiles of substrates polished using a respective classified retaining ring. After training, the neural network can generate a prediction, by inferencing the trained neural network with the input of geometrical information of a retraining ring, of a polishing profile (e.g., an edge polishing profile) for a substrate polished using the retaining ring.

Therefore, systems adopting the described techniques can detect whether a retaining ring is defective based on the measured bottom surface profile of the retaining ring, adjust a polishing process when using a retaining ring based on the obtained parameters, and predict a polishing profile of a substrate undergoing polishing with a retaining ring. The systems can improve in-wafer uniformity after polishing and increase the throughput for polishing.

FIG. 1 illustrates an example of a polishing apparatus 100. The polishing apparatus 100 includes a rotatable disk-shaped platen 120 on which a polishing pad 110 is situated.

The platen 120 is operable to rotate about an axis 125. For example, a motor 121 can turn a drive shaft 124 to rotate the platen 120. The polishing pad 110 can be detachably secured to the platen 120, for example, by an adhesive layer. The polishing pad 110 can be a two-layer polishing pad with an outer polishing layer 112 and a softer backing layer 114.

The polishing apparatus 100 can include a dispensing port 130 to deliver a polishing liquid 132, such as an abrasive slurry, onto the polishing pad 110.

The polishing apparatus can also include a polishing pad conditioner to abrade the polishing pad 110 to maintain the polishing pad 110 in a consistent abrasive state.

The polishing apparatus 100 includes a carrier head 140 operable to hold a substrate 10 against the polishing pad 110. The carrier head 140 can be configured to control a polishing parameter independently, for example, pressure, for each of multiple zones on the substrate 10.

The carrier head 140 is suspended from a support structure 150, e.g., a carousel, and is connected by a drive shaft 152 to a carrier head rotation motor 154 so that the carrier head can rotate about an axis 159. Optionally the carrier head 140 can oscillate laterally, e.g., on sliders on the carousel 150, or by the rotational oscillation of the carousel itself. In operation, the platen is rotated about its central axis 125. Each carrier head is rotated about its central axis 159 and translated laterally across the polishing pad's top surface.

The carrier head 140 can include a housing 144 that can be connected to a drive shaft 152, a support plate 184 that extends above a flexible central membrane 182, an annular pressure control assembly 195 that surrounds the flexible central membrane 182, and a retaining ring 142 that surrounds the annular pressure control assembly 195 to retain the substrate 10 below the flexible central membrane 182.

The lower surface of flexible central membrane 182 provides a mounting surface for the substrate 10. The flexible central membrane 182 can include one or more flaps secured to the support plate 184 to form one or more pressurizable chambers. These chambers are connected to one or more pressure supplies 181 through respective pressure supply lines 183 for applying different pressure onto the inner area (e.g., regions at least 6 mm away from the substrate edge) of a substrate when polishing so that the system can adjust respective polishing rates on respective regions in the substrate.

Figure 2A:
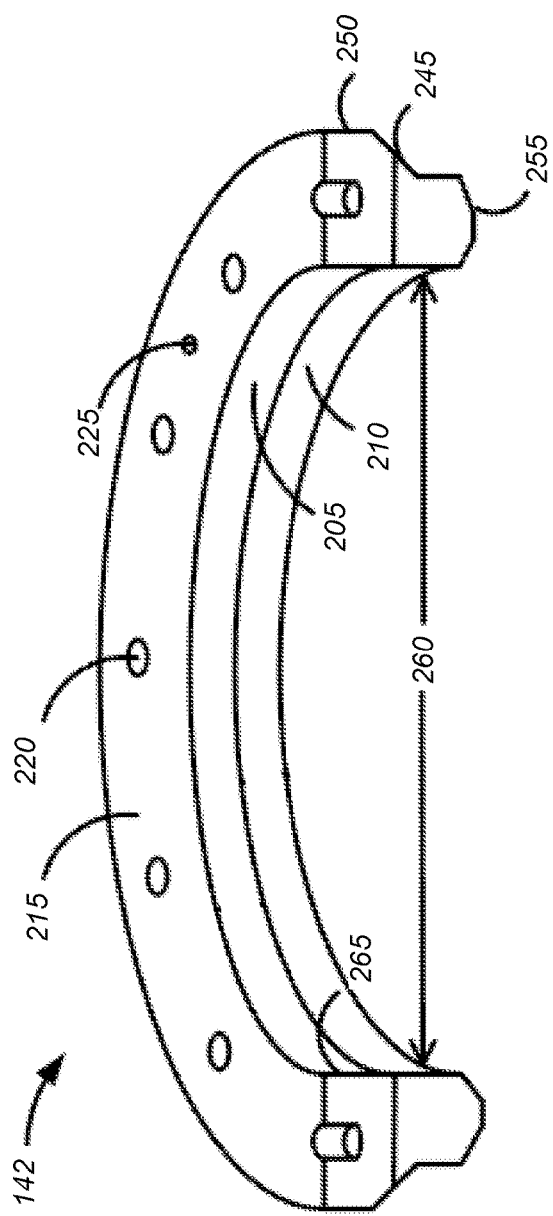
FIG. 2A illustrates a schematic perspective and cross-sectional view of an example retaining ring.

FIG. 2A illustrates a schematic perspective cross-sectional view of an example retaining ring 142.

As described above, a retaining ring 142 is generally an annular ring that can be secured to a carrier head 140 of a polishing apparatus 100.

As shown in FIG. 2A, the upper portion 205 of the retaining ring 142 has a cylindrical inner surface 265, a cylindrical outer surface 250, and a top surface 215 that is generally perpendicular to both inner and outer surfaces. The top surface includes holes 220 to receive mechanical fasteners, such as bolts, screws, or other hardware (such as screw sheaths or inserts), for securing the retaining ring 142 and carrier head 140 together (not shown). Additionally, one or more alignment apertures 225 can be located in the top surface 215 of the upper portion 205 to align the retaining ring 142 and carrier head 140 properly.

The upper portion 205 can be formed from a rigid or high tensile modulus material, such as a metal, ceramic or hard plastic. Suitable metals for forming the upper portion include stainless steel, molybdenum, titanium, or aluminum. In addition, a composite material, such as a composite ceramic, can be used.

The second piece of the retaining ring 142, the lower portion 210, can be formed from a chemically inert material to the CMP process and may be softer than the material of the upper portion 205. The material of the lower portion 210 should be sufficiently compressible or elastic that contact of the substrate edge against the retaining ring 142 does not cause the substrate to chip or crack. The lower portion 210 should also be durable and have high wear resistance, although it is acceptable for the lower portion 210 to wear away. For example, the lower portion 210 can be made of plastic, such as polyphenylene sulfide (PPS), polyethylene terephthalate (PET), polyetheretherketone (PEEK), carbon filled PEEK, polyetherketoneketone (PEKK), polybutylene terephthalate (PBT), polytetrafluoroethylene (PTFE), polybenzimidazole (PBI), polyetherimide (PEI), or composite material.

The lower portion may also have a cylindrical inner surface 235, a cylindrical outer surface 230, and a bottom surface 255. Although the bottom surface 255 of the retaining ring 142 can start planar, after break-in or use, the lower portion's bottom surface 255 typically has a non-planar profile. In certain implementations, the radial profile of the bottom surface 255 can include curved, frustoconical, or flat sections. It would be advantageous for the radial profile of the bottom surface 255 of the retaining ring 100 to substantially match a reference profile to enable wafer-to-wafer uniformity, but this may not be possible due to variations during manufacturing or break-in, or differing wear patterns in polishing.

Figure 2B:
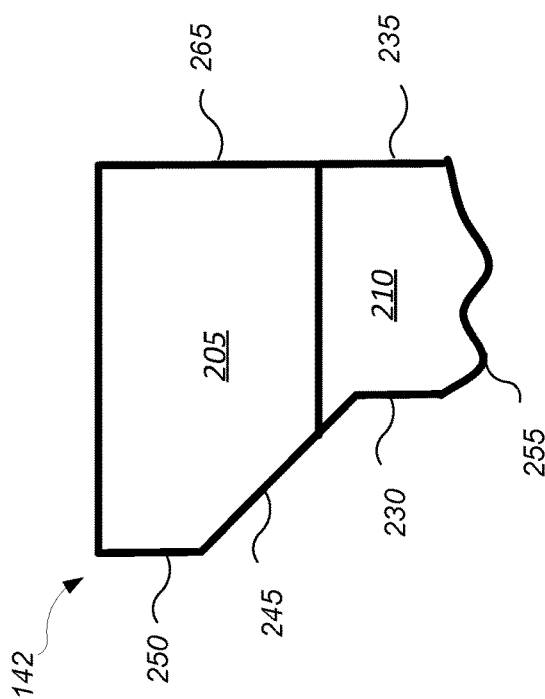
FIG. 2B illustrates a up schematic cross-sectional view of the retaining ring.

FIG. 2B illustrates a schematic cross-sectional view of the retaining ring 142 in which distortions of the bottom surface 255 are highly exaggerated for visibility. In practice, each retaining ring can have a slightly different bottom surface profile than the reference profile, which can cause unwanted non-uniformity over the edge region of a substrate undergoing polishing or wafer-to-wafer variation.

Figure 2C:
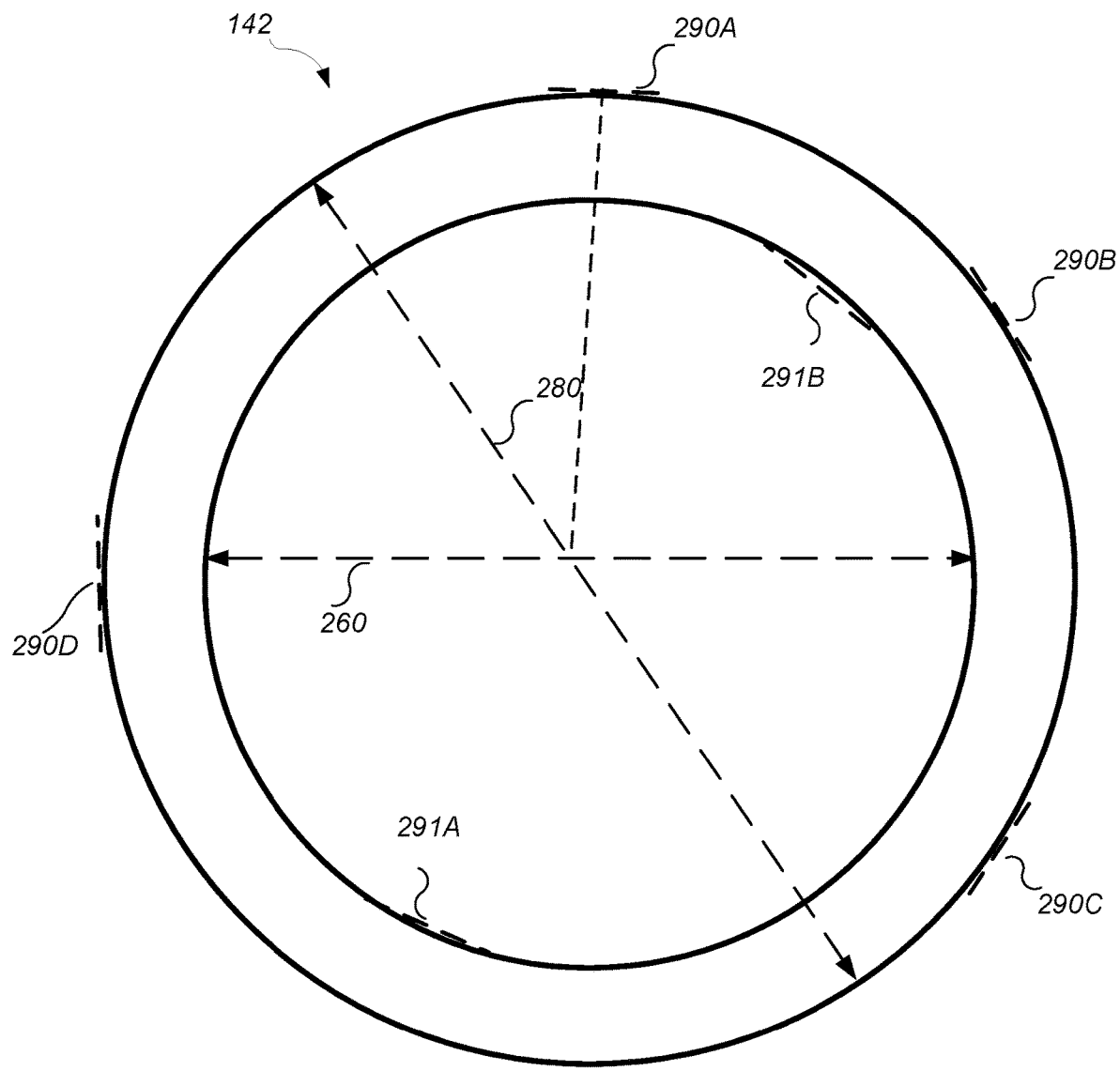
FIG. 2C illustrates a schematic bottom view of an example retaining ring.

FIG. 2C illustrates a schematic bottom view of an example retaining ring 142. Characteristics of a bottom surface profile of a retaining ring can include, as describes above, the height distribution of the bottom surface 255 (or equivalently, the thickness distribution of the lower portion 210), and the flatness of the bottom surface 255 (i.e., the height or thickness variation of the bottom surface 255), and roundness of the retaining ring.

As shown in FIG. 2C, the retaining ring has an inner diameter 260 and an outer diameter 280. If the ring is perfectly round, the width of the retaining ring can be determined by taking a difference between the inner diameter and the outer diameter. However, in practice, a retaining ring 142 can have a different curvature at a different angular position on both inner and outer boundaries, which results in imperfect roundness. For example, the outer boundary's curvatures at positions 290A, 290B, 290C, and 290D can be different from each other. As another example, the inner boundary's curvatures at positions 291A and 291B can be substantially the same.

Figure 3:
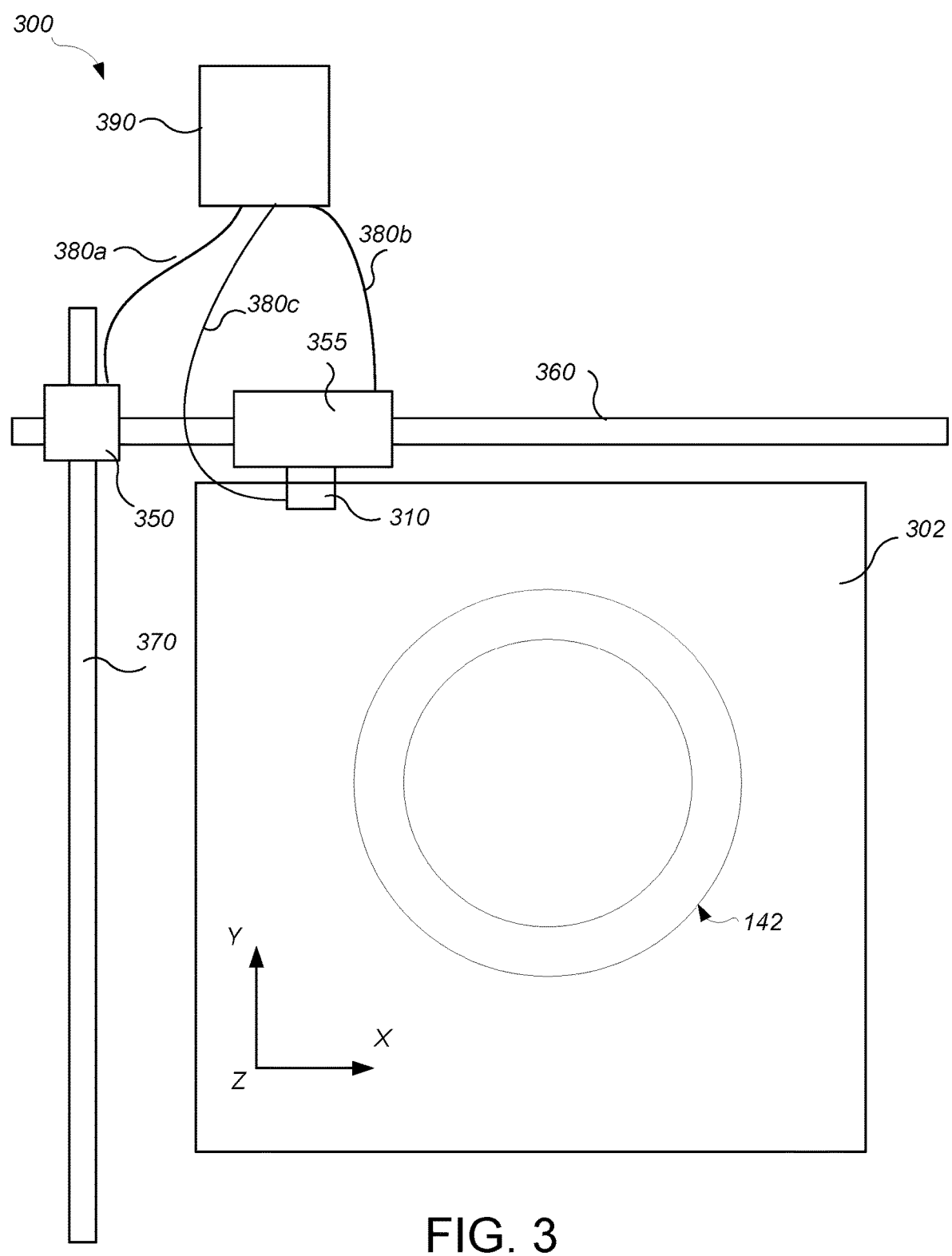
FIG. 3 illustrates a schematic top view of an example retaining ring undergoing measurements using a coordinate measurement machine.

FIG. 3 illustrates a schematic top view of an example retaining ring 142 undergoing measurements using a coordinate measurement machine 300. The retaining ring 142 is sitting with the bottom surface face-up.

To perform measurements of a retaining ring's bottom surface, the retaining ring is mounted onto a carrier head, and a coordinate measurement machine (CMM) 300 performs measurements of the bottom surface of the retaining ring. The system can take measurements of the bottom of the retaining ring.

The CMM 300 can include a sensor 310 configured measure the vertical position of each of a plurality of points on the bottom surface of the retaining ring. The sensor 310 can be any sensor suitable, for example, a laser sensor, a contact probe. In some implementations, the sensor 310 can perform measurements of a height or thickness coordinate (Z-direction coordinate) at each measured point on the retaining ring's bottom surface.

The CMM 300 can include actuators 350 and 355 that the sensor 310 can be mounted on and moved around to probe height information for the bottom surface of a retaining ring. For example, sensor 310 is mounted on the actuator 355. Each of the two actuators can move in a non-correlated direction (e.g., not parallel) so that the sensor 310 can be moved to cover the entire X-Y plane. For example, the actuator 355 can move along a rail 360 in the X-direction, and the actuator 350 can move along another rail 370 in the Y-direction, perpendicular to the X-direction.

The CMM 300 can also include a controller 390 with control lines 380a, 380b to control the actuators 350, 355, respectively, and a data or control line 380c to control the sensor's operation and receive captured height information (Z-coordinate) of a measured region.

Figure 4B:
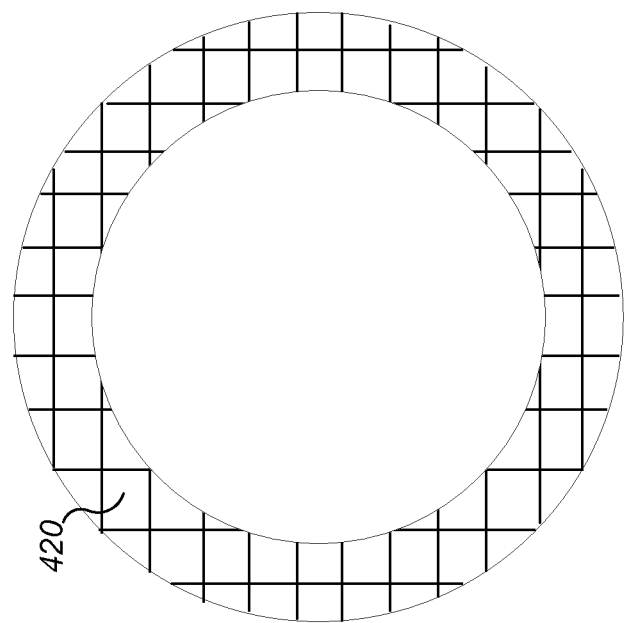
FIGS. 4A and 4B illustrate schematic top views of different types of mesh scans for measurements.
Figure 4A:
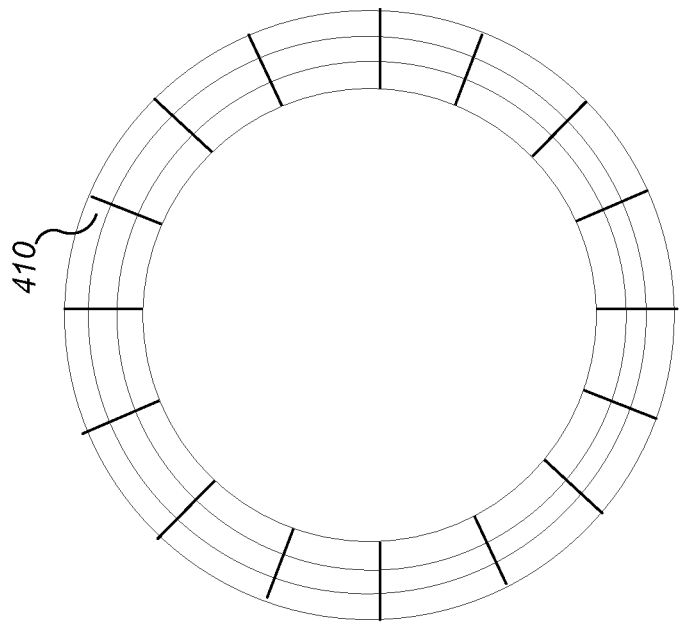

FIGS. 4A and 4B are schematic diagrams of different types of mesh grids. Measurements can be distributed in a radial mesh 410, e.g., as shown in FIG. 4A, or in a rectangular mesh 420, e.g., as shown in FIG. 4B. Each mesh can have any suitable sizes based on a respective measurement density. The CMM 300 can take measurements of regions in millimeters to centimeters. For example, each radial mesh in FIG. 4A can have edges of a size around 1 mm. The CMM 300 can generate a thousand to ten thousands of measurements over a bottom surface of a retaining ring. For example, the total number of meshes in FIG. 4B is around 3000.

Figure 5:
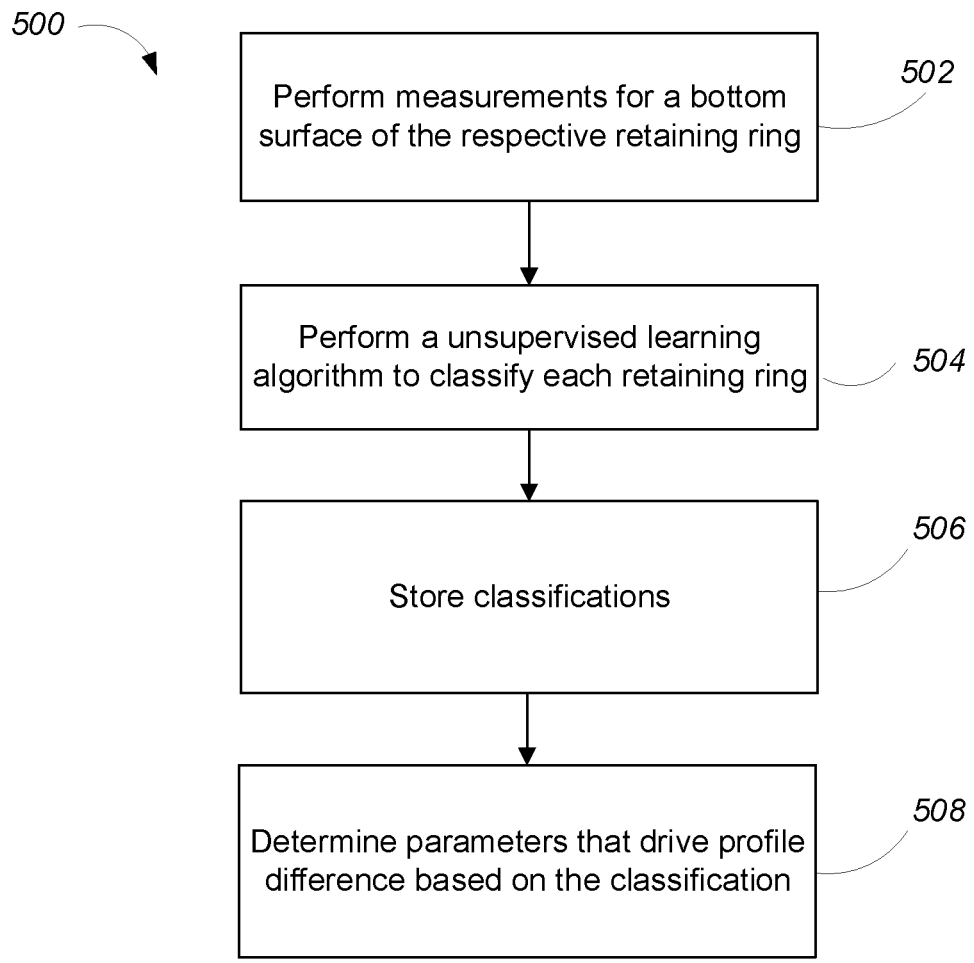
FIG. 5 is a flow diagram showing an example classification process for retaining rings using machine learning algorithms.

FIG. 5 is a flow diagram showing an example classification process 500 for retaining rings, e.g., using machine learning algorithms.

The CMM 300 makes measurements of the bottom surface of the respective retaining rings. Each measurement represents the vertical height or thickness at the position of the measurement (502). As described above, before taking measurements, each retaining ring is mounted to a corresponding carrier head. In some implementations, the system takes measurements of one or more retaining rings that have been previously broken-in.

The controller 390 can receive measurements and can transform the measurements into a characteristic of the bottom surface at the measured position, e.g., the overall flatness of the bottom surface, the ring taper, the roundness, and an averaged inner or outer diameter for the respective retaining ring.

In some implementations, the controller 390 can determine the roundness by generating data representing a level of symmetry of the bottom surface of a retaining ring with respect to the rotation axis. For example, the level of symmetry can include data representing curvature distribution on boundaries of a retaining ring. Therefore, the system can measure and determine the roundness of a retaining ring by determining an asymmetric curvature distribution based on the measured curvature data.

To analyze the flatness, roundness, and ring taper of a retaining ring, the system first generalizes a spatial mapping of the retaining based on the measurements in the Cartesian coordinate frame. The system then adopts suitable numerical techniques to process the spatial mapping to generate consistent mapping across different measurements of different retaining rings. More specifically, each measurement data includes a respective reference plane and a respective reference center point, and each measurement data represents height information for each measurement point with respect to the respective reference plane and reference center point. The system can use different techniques to normalize each measurement data. For example, the system can generate a shared center for each measurement data using numerical techniques such as "best fit plane" or "smallest enclosed circle" to normalize the measurement data for the spatial mapping. As another example, the system can use one or more data filters to screen outlying data to improve each measurement's integrity.

After the above-described data processing, the system then stores the processed data representing one or more characteristics of a retaining ring's bottom surface profile for analysis.

The system then performs an unsupervised learning algorithm to classify each of the plurality of retaining rings in a respective category based on measurements of the plurality of retaining rings (504). To classify each of the plurality of retaining rings, the system first generates one or more characteristics from the stored data in step 502. The one or more characteristics can be any suitable type to represent one or more features of measured data representing the bottom surface profile. For example, the characteristics for measured data representing the bottom surface can be an overall averaged thickness, a variation of thickness in the angular direction, radial direction, or both (i.e., flatness), roundness of the inner boundary, the outer boundary, or both, or a level of symmetry. Each of the characteristic types has a respective feature map for analysis.

The system can use any suitable unsupervised learning algorithm for classification. In one of the preferred embodiments, the system adopts the K-means method. More specifically, the system can assume several categories (e.g., scalar value K for K-means) for the measured retaining rings, assume a cluster center for each category in a particular feature map, and assign each of the retaining rings into closest category (i.e., a retaining ring is assigned to a category with a cluster center closest to the characteristic type of the retaining ring in the particular feature map.) The system can generalize a global error (e.g., squared Euclidean distance) for assigning each of the retaining rings into a respective category, and minimize the global error by adjusting the assignment. The system can also update respective cluster centers for categories based on the respective characteristics of retaining rings assigned to respective categories upon each assignment adjustment.

The system can determine the number of categories. To determine, the system can first select a plurality of candidate numbers of categories for the K-means algorithm, and obtain respective candidate errors (i.e., respective minimized global errors) for assigning the retaining rings into one of the plurality of candidate numbers of categories (i.e., different Ks). For example, the system can perform classifications over 2 categories (i.e., K=2), 3 categories (i.e., K=3), and 10 categories (i.e., K=10), and obtain respective minimized global errors. The system can select, as the number of categories of the K-means algorithm for classifying the retaining rings, one of the plurality of candidate numbers of categories based on the minimum candidate error. For example, the system can set K to be the number of categories with the minimum candidate error. As another example, the system can set K to be the number of categories with the second minimum candidate error at the cost of the least computation time.

The system stores classifications generated by the unsupervised learning algorithm (506). For example, the system stores the determined number of categories K, the cluster center for each category in a respective feature map, and the classification tag for each retaining ring. In some implementations, the system can store the category with the most assigned retaining rings as a reference category.

The classifications can then be evaluated against polishing profile measurements to determine parameters that drive profile differences (508). For example, a user can cause the system to graph various performance metrics against various ring characteristics. For example, edge uniformity could be graphed as a function of the shape of the inner edge roundedness to determine whether and how inner edge shape affects the polishing profile.

The system can be used to adjust retaining rings that are not classified into one or more preset categories. For example, the system can store data indicating that several categories provide acceptable results in polishing. A sample ring can then be measured by the CMM system, and subject to the classification algorithm. If the sample ring does not fall into an indicated category, corrective action can be taken. For example, the retaining ring can be subject to further "break-in" for a period of time, and measurements of the "broken-in" bottom surface can be made, This process can be repeated until the retaining rings are classified into an acceptable category.

The system can predict an after-polishing profile of a substrate using a classified retaining ring. To predict, the system can collect a plurality of polishing profiles using retaining rings in a particular category, and generate an average polishing profile as the predicted after-polishing profile for the substrate to be polished using a retaining ring classified in the category.

Figure 6:
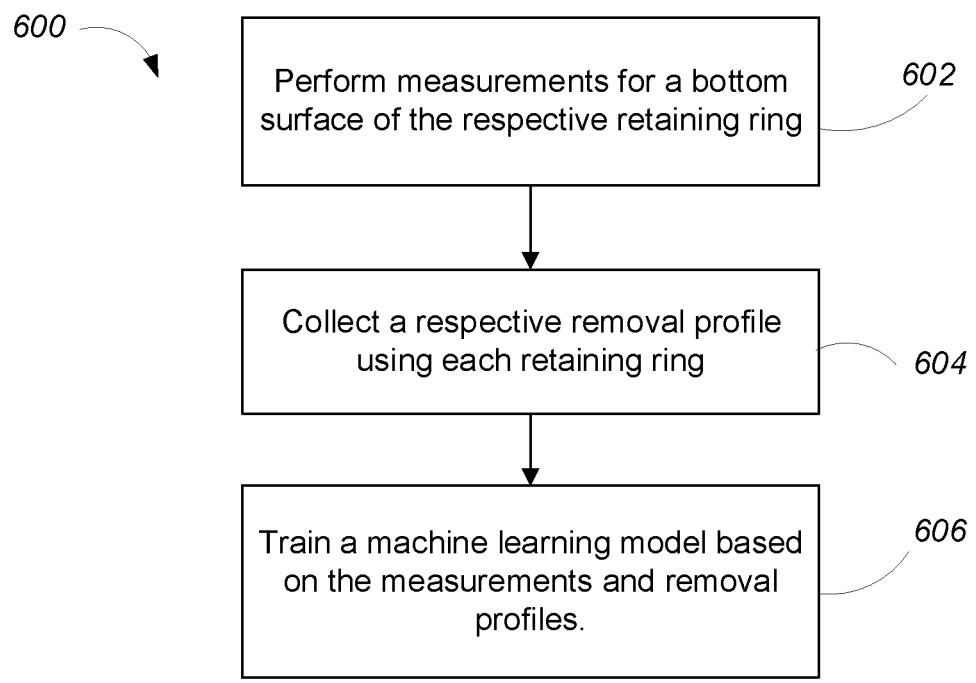
FIG. 6 is a flow diagram showing an example process of training a neural network for predicting polishing profiles based on input data.

FIG. 6 is a flow diagram showing an example process 600 of training a neural network for predicting polishing profile based on input data. The process 600 can be executed by one or more computers located in one or more places. Alternatively, the process 600 can be stored as instructions in the one or more computers. Once executed, the instructions can cause one or more components of a polishing apparatus, one or more components of a CMM, or the one or more computers to execute the process. For example, at least some steps of the process are executed by the controller 190, as shown in FIG. 1.

Similarly, as described for step 502 in FIG. 5, measurements of the bottom surface of the respective retaining ring are made using a coordinate measurement machine. The measurements represent a characteristic of the bottom surface. (602). The characteristic of the bottom surface can be the surface height or surface thickness. More specifically, the system can generate a special mapping for each retaining ring and store the measured data in memory. In some implementations, the system can perform measurements over retaining rings that have been previously "broken-in."

The system then collects a respective removal profile of a substrate polished using the respective retaining ring (604), and trains a machine learning model based on the measurements of the bottom surface of the retaining ring and the respective removal profiles (606).

The machine learning model includes a convolutional neural network model that can be trained using training examples. The training examples include training input such as input bottom surface profiles of each retaining ring, and polishing profiles of substrates polishing using respective retaining rings, and training labels for each polishing profile.

In some implementations, the system can label each polishing profile. For example, the system can assign a first label (e.g., "edge fast") for a plurality of polishing profiles, each having a fast edge removal rate compared to a reference profile, and label as "edge slow" for a plurality of polishing profiles each having a slow edge removal rate.

The system can train the neural network model by minimizing a global misclassification error based on training examples. During the training, the system updates weights for each layer of the neural network through backpropagation to minimize the global error.

After training the neural network, the system can predict a removal profile for a substrate using the trained neural network. More specifically, the system can measure a bottom surface profile, or provide the saved data representing a measured bottom surface profile, of a retaining ring to the trained neural network, and perform inference operations using the trained neural network with trained weights to generate a prediction of polishing profile using the retaining ring. Alternatively or in addition, the system can predict a label for the predicted polishing profile using the trained neural network.

The system can continue training the neural network with incoming measurements such that the weights of neural network can be updated based on the newer measurement data. The system can store the trained neural network with updated weights in the memory of one or more computers in one or more locations. The trained neural network can be accessed by one or more computers or computing units to accelerate the inference operations.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

Embodiments of the classification and training of a machine learning model described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a standalone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the subject matter have been described. Other embodiments are within the scope of the following claims.

What is claimed is:

1. A method for optimizing polishing, the method comprising:
    for each respective retaining ring of a plurality of retaining rings mounted on a particular carrier head
        scanning a bottom surface of the respective retaining ring mounted on the particular carrier head using a coordinate measurement machine to generate measurements that represent a characteristic of the bottom surface, and
        collecting a respective removal profile of a test substrate polished using the respective retaining ring;
    training a machine learning model based on the measurements of the bottom surface of the retaining rings and the respective removal profiles to provide a trained machined learning model configured to receive a measurement of a bottom surface of a retaining ring and generate a predicted removal profile for a substrate for a substrate to be polished using the respective retaining ring having the measurements that represent the characteristic of the bottom surface;
    before polishing of the substrate, receiving a plurality of measurements representing a profile of a bottom surface of a particular retaining ring;
    providing the plurality of measurements to the trained machine learning model to generate the predicted removal profile of the substrate;
    generating an adjusted polishing parameter in response to the predicted removal profile to improve polishing uniformity of the substrate; and
    causing a polishing system to polish the substrate with the adjusted polishing parameter.

2. The method of claim 1, comprising:
    measuring a bottom surface of a particular retaining ring; and
    inputting the measurements to the trained machine learning model to generate a predicted removal profile.

3. The method of claim 1, wherein the characteristic of the bottom surface is the surface height or ring layer thickness.

4. The method of claim 1, wherein collecting the respective removal profile of a substrate polished using the respective retaining ring, comprises:

determining a respective removal profile label for the respective removable profile for training.

5. The method of claim 4, wherein the respective removal profile label comprise a first label representing fast removal rate in edge region of the substrate, and a second label representing slow removal rate in edge region of the substrate.

6. The method of claim 1, wherein the machine learning model comprises a convolutional neural network.

7. The method of claim 1, wherein performing measurements for the bottom surface of the respective retaining ring comprises performing measurements of roundness of the respective retaining ring by determining asymmetric curvature distribution.

8. The method of claim 1, wherein performing measurements for the bottom surface of the respective retaining ring comprises performing multiple measurements across the bottom surface at different width and angular positions.

9. The method of claim 8, wherein performing multiple measurements across the bottom surface includes dividing the bottom surface of the retaining ring into a plurality of regions of the retaining ring, and for each of the plurality of regions, measuring an in-plane location for the region and an average thickness of the region.

10. The method of claim 1, wherein the plurality of retaining rings comprises one or more retaining rings that have been broken-in.

11. The method of claim 1, wherein the adjusted polishing parameter is one more pressures in a plurality of pressurizable chambers of the particular carrier head.

12. The method of claim 1, wherein the adjusted polishing parameter is a polishing rate.

13. The method of claim 1, wherein the polishing parameter comprises a pressure on the substrate.

14. The method of claim 1, wherein the machine learning model comprises a neural network.

15. The method of claim 1, wherein the profile is a surface height profile or a layer thickness profile.

* * * * *